United States Patent [19]

Burns

[11] Patent Number: 5,528,075
[45] Date of Patent: Jun. 18, 1996

[54] LEAD-ON-CHIP INTEGRATED CIRCUIT APPARATUS

[75] Inventor: Carmen D. Burns, Austin, Tex.

[73] Assignee: Staktek Corporation, Austin, Tex.

[21] Appl. No.: 375,874

[22] Filed: Jan. 20, 1995

Related U.S. Application Data

[62] Division of Ser. No. 783,737, Oct. 28, 1991, Pat. No. 5,448,450, which is a division of Ser. No. 746,268, Aug. 15, 1991, Pat. No. 5,221,642.

[51] Int. Cl.$^6$ ................................................. H01L 23/495
[52] U.S. Cl. ........................... 257/666; 257/668; 257/676
[58] Field of Search ........................... 257/666, 783, 257/668, 676

[56] References Cited

U.S. PATENT DOCUMENTS

| | | | |
|---|---|---|---|
| 4,684,975 | 8/1987 | Takiar et al. | 357/70 |
| 4,796,078 | 1/1989 | Phelps, Jr. et al. | 357/68 |
| 4,862,245 | 8/1989 | Pashby et al. | 357/70 |
| 4,948,645 | 8/1990 | Holzinger et al. | 428/40 |
| 4,994,411 | 2/1991 | Naito et al. | 437/209 |
| 4,997,517 | 3/1991 | Parthasarathi | 156/630 |
| 5,041,015 | 8/1991 | Travis | 439/492 |
| 5,086,018 | 2/1992 | Conru et al. | 437/207 |
| 5,089,876 | 2/1992 | Ishioka | 357/70 |
| 5,108,553 | 4/1992 | Foster et al. | 205/125 |
| 5,151,559 | 9/1992 | Conru et al. | 174/52.4 |
| 5,214,845 | 6/1993 | King et al. | 29/841 |
| 5,221,642 | 6/1993 | Burns | 437/207 |
| 5,227,232 | 7/1993 | Lim | 257/668 |
| 5,256,903 | 10/1993 | Obata et al. | 257/783 |
| 5,359,224 | 10/1994 | Heinen et al. | 257/787 |

FOREIGN PATENT DOCUMENTS 63-53959  8/1988  Japan .

Primary Examiner—William Mintel
Assistant Examiner—Roy Potter
Attorney, Agent, or Firm—Fulbright & Jaworski

[57] ABSTRACT

A method and apparatus for achieving lead-on-chip integrated circuit packages by transferring at least one extremely thin adhesive from a carrier onto the face of integrated circuit chips, laminating a lead frame to the last adhesive layer, curing the adhesive to act as an insulator, bonding to the integrated circuit chip connection pads and encapsulating the chip and lead frame. A polypropylene carrier having adhesive patches pre-shaped and oriented in relation to the integrated circuit chips is brought into contact with the heated chips by either vacuum or pressure action wherein the adhesive is transferred from the polypropylene carrier to the faces of the chips. Thermally conductive and electrically insulating filling may be used with the adhesive to improve heat conduction from the IC. Compliant adhesive reduces thermally induced stresses between the lead frame and IC chip. Both the improved thermal performance and reduced moisture absorption of the encapsulated package improves the reliability of the integrated circuit package.

10 Claims, 15 Drawing Sheets

LEAD-ON-CHIP INTEGRATED CIRCUIT APPARATUS

This application is a divisional of application Ser. No. 07/783,737, filed Oct. 28, 1991, U.S. Pat. No. 5,448,450 which is a divisional of application Ser. No. 07/746,268, filed Aug. 15, 1991, U.S. Pat. No. 5,221,642.

BACKGROUND OF THE INVENTION

1. Field of the Invention

This invention relates to a method and apparatus for fabricating lead-on-chip integrated circuit packages. In particular, the invention relates to attaching a lead frame to an integrated circuit chip that results in improved thermal transfer of heat from within the integrated circuit package.

2. Discussion of the Related Technology

Packaging techniques for integrated circuits have been developed in the past in an attempt to satisfy demands for miniaturization in the semiconductor industry. Improved methods for miniaturization of integrated circuits enabling the integration of millions of transistor circuit elements into single integrated silicon embodied circuits, or chips, have resulted in increased emphasis on methods to package these circuits in space efficient, yet reliable and mass producible packages.

Integrated circuits are created from a silicon wafer using various etching, doping and depositing steps that are well know in the art of fabricating integrated circuit devices. A silicon wafer may be comprised of a number of integrated circuit dies that each represent a single integrated circuit chip. Ultimately, the chip may be packaged by transfer molding plastic encasement around the chip with a variety of pin-out or mounting and interconnection schemes. For example, M-Dip (Dual-In-Line-Plastic) provides a relatively flat, molded package having dual parallel rows of leads extending from the bottom for through-hole connection and mounting to an underlying printed circuit board. More compact integrated circuits allowing greater density on a printed circuit board are the SIP (Single-In-Line-Plastic), and PLCC (Plastic Leaded Chip Carrier), SOJ (Small Outline J-leaded) molded case packages.

An integrated circuit is comprised of many interconnected transistors and associated passive circuit elements that perform a function or functions. These functions may be random access memory, central processing, communications, etc. Different types of integrated circuits are used to create a machine such as a personal computer. Combining integrated circuits requires electrically connecting each integrated circuit and also connecting to other devices such as keyboards, video monitors and printers. In order to accomplish this interconnection, conductive paths must be made available to connect the internal circuitry of an integrated circuit ("IC") to external electrical circuits.

Typically, an array of electrical conductors called a "lead frame" is used as an interface between the IC and external circuitry for facilitating interconnection. In the case of the lead-on-chip package, the lead frame is designed to align with and connect to the integrated circuit connection pads located on a face of the IC chip. These connection pads are the points at which all input and output signals, and power and ground connections are made for the IC to function as designed.

In the case of the lead-on-chip variety of IC package, the conductors of the lead frame may be any metal suitable for bonding and may be plated, either selectively or non- selectively, as is well known in the art. Each type of IC requires a lead frame with a specific pattern of wires. This pattern may be fabricated using etching or stamping principles well known in the art of printed circuits. In addition to having the correct pattern for a specific IC, the lead frame must be properly aligned and held in alignment with the IC connection pads. Once aligned the lead frame may be connected to the IC connection pads by wire bonding, tape automated bonding ("TAB"), wedge bonding or other methods well known in the art. Ball or wedge wire bonding may be aligned with the alignment fixture pins and may have a tolerance of 5 mils. TAB bonding requires more precision in the alignment of the lead flames and is normally set into place by means of automatic recognition alignment equipment which achieves a 0.5 to 1 mil tolerance.

Typically, the lead frame is held in alignment with the IC connection pads by fixedly attaching it to the IC face having the connection pads thereon. The IC face must be insulated from the lead frame because the transistors and silicon substrate that comprise the IC are exposed and would short out if the conductive lead frame came into contact with the transistors or substrate. Therefore, insulation of some type is required between the IC face having the connection pads and the lead frame.

A three layer sandwich consisting of a polyimide film carrier, such as Kapton (R), with adhesive on both sides has been used as a means for attaching the lead frame to the IC. Polyimide absorbs moisture which degrades the reliability of an integrated circuit package. The polyimide carrier may be as thin as 1 mil with adhesive of 0.5 mils on both sides making this sandwich a total thickness of 2 mils. Sandwich material thinner than 2 mils is difficult or impossible to handle as a single piece part during fabrication of the IC. Thus, the overall thickness of an IC package is affected by the 2 mil or greater thickness of the insulation and adhesive presently used during fabrication. Heat generated by the IC circuits must flow by thermal conduction through the 2 mil (three layer) dielectric polymer sandwich into the lead frame where the heat may be dissipated into the encapsulating package and/or into external heat conductive circuits.

In contrast to such prior technology, the packaging method and apparatus of the present invention attaches a lead frame to an integrated circuit chip that results in improved thermal transfer of heat from within the integrated circuit package by reducing the insulation thickness which greatly improves the thermal conduction of heat from the IC chip. Heat removal to the lead frame is improved linearly with the reduction of the sandwich thickness. In addition, the present invention may use an epoxy as both an adhesive and insulator that has at least one tenth the moisture absorption of polyimide. Reduction in the amount of moisture absorption improves the reliability of the integrated circuit package. Use of the present invention results in a reliable, cost efficient and easily manufactured IC die element packaged in transfer molded casing (hereinafter referred to as a "level-one package"). The packaging method of the invention uses a substantially thinner insulating layer or layers that also aid in obtaining an ultra thin level-one package which has particular utility in any number of high density space sensitive applications requiring ultra thin integrated circuit packaging. When the thermal conduction of the package is improved, the junction temperatures of the transistors in the IC are lowered, thus, improving the reliability of the IC in a standard package. In addition, this improved thermally conductive package may now be used in a higher thermal density application without degradation in overall performance.

SUMMARY OF THE INVENTION

The present invention provides a method and apparatus for fabricating a lead frame attached to an integrated circuit die, resulting in an overall integrated circuit package that has improved thermal transfer characteristics resulting in better dissipation of heat from the integrated circuit die when using at least one layer of polymer. In addition, reducing the thickness of the insulation layer between the chip die and the lead frame aids in obtaining an ultra-thin IC package. The present invention also discloses a novel manufacturing process for assembling IC packages in a cost effective and simple to use assembly process.

One way to increase space efficiency and improve the performance of electronic equipment is to stack integrated circuit packages closely together. More integrated circuit packages may be stacked in a given space if the integrated circuit packages used are ultra-thin. However, there is a trade off in the resulting package being able to dissipate the heat generated by the active electronic elements contained therein. The present invention improves both packaging density and heat dissipation characteristics resulting in a smaller density package having a higher power dissipation.

In order to achieve the thinnest package possible all fabrication layers needed to construct a useful integrated circuit must be minimized in thickness and number. The present invention aids in obtaining an ultra thin package by reducing to a minimum the number of layers and the thickness of each layer when attaching a lead frame to an integrated circuit die.

The preferred embodiment of the invention uses at least one very thin layer of adhesive placed onto the face of the IC having the connection pads, leaving only the connection pads exposed. This adhesive layer may be cured or partially cured (B-staged) to become an insulator over the face of the IC die except for the connection pads. By controlling the heat of the IC, pressure applied when laminating the lead frame and time used to cure the adhesive layer a very thin Single layer may be used without additional layers of adhesive. A compliant adhesive, such as phenolic butyryl epoxy, may be used as an adhesive to relieve stress caused by dissimilar thermal expansion of the lead frame and IC die. The single layer may be filled with a thermally conductive and electrically insulated material such as, for example, fused quartz (silica). A thermally filled layer need not be ultra-thin for good thermal conduction.

Another layer of adhesive substantially identically shaped as the first layer may be applied over the first layer. The lead frame may be laminated to the subsequent layer. The lead frame is aligned with the IC chip connection pads so that connection may be made by wire or tape automated bonding as is well known in the art of fabricating integrated circuits. The cured first layer acts as a stand-off insulator to prevent the lead frame from touching the surface of the IC and shorting out the transistors therein. By applying two very thin (typically 0.25 to 0.8 mil) adhesive layers and a reduced thickness lead frame, the overall IC package may be proportionately reduced. The adhesive may be epoxy, such as Rogers Corp. R/flex (R) 8970 which is B-staged phenolic butyryl epoxy, that may be laminated at a temperature of 130 degrees centigrade and cured at a temperature of 175 degrees centigrade.

In standard molded IC packages heat is predominately dissipated through the bulk thermally conductive molded epoxy, the thinner the laminate or thermally filled laminate the better the thermal transfer characteristics of heat from the IC chip into the molded epoxy package. In the case of ultra thin packages used for dense stacking the heat from the IC chip is dissipated almost entirely through the lead frame where the thinner laminate or filled laminate also improves the thermal heat transfer of the IC package.

A unique aspect of the invention is the method of applying the adhesive to the face of the IC. Heretofore a 2 mil thick sandwich of polyimide film, such as Kapton (R), with adhesive on both sides (a three layer system) was used as an insulator and a means to hold the lead frame to the IC chip face. The present invention applies an ultra thin layer of adhesive to the face of the IC chip by transferring the adhesive from a disposable carrier that may be easily aligned with a plurality of IC chips. This method of application may be used for one, two or more layers of polymer or thermally filled polymer. Polymeric film may be used as an alpha barrier as suggested in U.S. Pat. No. 4,426,657 by Abiru, et al. For example, one such polyimide film is Kapton (Reg. trademark of Dupont).

The carrier may be, for example, a 1.5 to 6 mil polypropylene sheet having an ultra-thin layer of adhesive such as B-staged epoxy. The thickness of the adhesive may be, for example, from 0.25 mils to 0.8 mils. The adhesive may be coated and B-staged onto the carrier as thin as practical because the strength required for handling during the manufacturing process is obtained from the polypropylene sheet. Thus, the polypropylene sheet acts as a disposable carrier for the ultra-thin adhesive.

A plurality of similar IC chips may be aligned in a vacuum alignment fixture by means of pins precisely spaced so that the edges of the IC chips are in contact with these pins and align the IC chips in a registration of plus or minus 0.5 mil or better. The IC chips being held to the fixture by vacuum means. One or more IC chips may be aligned in a linear or rectangular array. Once the IC chip alignment is established an adhesive carrier alignment fixture may be designed to align or correspond with the IC chip alignment fixture.

Rectangular patches of adhesive may be established on the polypropylene sheet carrier by skiving (cutting grooves in) the adhesive just deep enough to allow the excess adhesive to be lifted off of the polypropylene sheet. An electronic X-Y cutter with Z-axis control can skive a pattern of rectangular patches of adhesive in proper alignment for placement onto the IC chips held in the chip fixture. The cutter skives in an X and Y direction defining each rectangular patch and lifts the skiving blade up in the Z direction so as not to cut the adhesive to be removed, i.e. leaves the excess adhesive uncut. After skiving the adhesive, the excess adhesive may be lifted off of the polypropylene sheet in one piece like dough off of a cookie sheet. This leaves the adhesive carrier with the required number and size of adhesive patches oriented for proper placement onto the IC chips.

The adhesive carrier fixture is placed in alignment with the IC chip fixture wherein the patches of adhesive attached to the polypropylene carrier may be approximately 10 to 100 mils above the faces of the IC chips. The IC chips are heated between 120 and 140 degrees centigrade and a vacuum is pulled in the chamber formed by the adhesive carrier and the IC alignment fixture. As the air is removed from the chamber the polypropylene sheet is pushed down by atmospheric pressure forcing the patches of adhesive to contact the IC faces. Using a vacuum helps in preventing air bubble from forming between the faces of the IC chips and the adhesive patches. However, an alternate embodiment of the invention may use air pressure from above the adhesive carrier to push the carrier containing the adhesive patches onto the faces of the IC chips.

External weight also may be used to push the carrier toward the faces of the IC chips. Yet another embodiment of the invention uses a knife edge to push the carrier toward the faces of the IC chips, thus, transferring the adhesive patches onto the faces of the IC chips.

When the adhesive contacts the hot IC it adheres to the face of the IC, the vacuum on the polypropylene sheet is released and the polypropylene sheet is then cut away from the alignment fixture and peeled off of the hot IC chips which remain held to the fixture by vacuum means. The rectangular adhesive patches remain on the IC faces in proper alignment. This first transfer of adhesive may be cured so as to function as an insulator and spacer between the IC face and the lead frame.

A second layer of adhesive is transferred onto the cured first layer of adhesive using the same method as described above. Lead frames are then aligned and placed on the second layer of adhesive, attached to the IC chips, using a mechanical alignment fixture. The lead frames may be laminated to the second layer of adhesive by a measured downward uniform force. This force may be applied with a flat plate of a stiff material such as ⅛" glass or stainless steel slightly larger than each IC face. The plates may be backed up with a compliant high temperature material such as silicon (¼"), selected for compliancy, and a flat weight or pressure on top to provide the necessary PSI needed for lamination.

The lead frames may be laminated to the adhesive by use of a thin stainless steel plate having short term flatness and long term compliancy. The short term flatness prevents the lead frame from being pushed into the edges of the IC face, thus, shorting out the conductive IC material. Long term compliancy compensates for different IC chip thicknesses during the lamination fabrication process. The thin stainless steel plate has a backing of semi-rigid high temperature material such as RTV. This high temperature RTV material may be backed up by a soft rubber material.

The thin stainless plate, RTV and soft rubber sandwich is placed on top of the lead frames held by a lead frame alignment fixture over the faces of the IC chips having adhesive already deposited thereon. A weight is placed on top of the soft rubber layer, thus, pressing the sandwich downwardly. The purpose of the soft rubber layer and the RTV is to more evenly distribute the pressure resulting from the application of the weight and for resilience over the possibly uneven thickness IC chips. Gentle even pressure on the lead frames causes the lead frames to laminate to the adhesive which may be B-staged and/or thermally filled. A first layer of adhesive may be used as an insulator then a second layer may be transferred as an adhesive for laminating the lead frame to the IC chip. A single layer of adhesive may be used for both insulating and laminating by controlling the temperature, pressure and time of lamination. A single layer may be used in this fashion by B-staging the adhesive before application to the IC face. A thermally filled layer may likewise be used in this manner. Laser cured insulating and spacing pedestals may be formed in a single layer of adhesive for application in this process also.

An embodiment of the invention applies a first layer of insulation to the IC while the IC is in wafer form prior to cutting the wafer into single chip dies. This is performed by screening selected patterns onto the IC wafer face. In the case of the ultra thin packages, the preferred embodiment uses a filled polyimide for the first thin layer. The filler is comprised of small particles of fused quartz (silica). The second layer is a polyimide formed after curing the first filled thin layer. A filled epoxy may also be used as a thin first layer. Using a filled thin layer greatly increases the thermal heat transfer properties of the polymer layer. The second layer may be a very thin B-staged polyimide or epoxy which will be activated by the heat of the subsequent lead frame lamination process (for a two layer system). In the case of a one layer system, the one and only layer of polyimide or epoxy may be B staged prior to the lamination process, activated during the lamination and cured after the lamination of the lead frame. The filled material will help to provide stand off insulation and separation of the lead frame from the IC surface.

Yet another embodiment of the present invention deposits the adhesive by means of skiving the adhesive on a carrier attached to a half moon roller and applying the rectangular patches, contained thereon, to the IC chip faces by mechanically rolling the adhesive patches onto the faces of the IC chips. This may be performed by a mechanical alignment gear on the roller and a linear gear on the IC alignment fixture.

Still a further embodiment of the present invention applies only one layer of adhesive as described above to the precut IC chips. The B staged adhesive is preprocessed in a scanning laser. The laser is programmed to apply heat to the epoxy film in a dot pattern, for example, of 10 mils in diameter and on 30 mil centers. Applying laser generated heat in this manner, pre-cures only the selected areas of the adhesive. This pre-cured single adhesive layer is then applied to the IC faces. The cured adhesive locations act as insulated pedestals that will space the lead frame from the IC face. The lead frame is aligned and laminated to this one layer system and the remaining uncured adhesive is cured to hold the lead frame in fixed alignment with the IC connection pads. A thermally filled adhesive layer may use the fused quartz filled polyimide polymer as an insulator and spacer for the lead frame. This filled adhesive would be B-staged for subsequent curing during the lamination process.

Another embodiment of the present invention uses small flat (i.e. metal or glass) plates to laminate the lead frame onto the adhesive. The plates are attached to a silicon film, for example about ¼ inch in thickness, that may be aligned with the IC chip alignment fixture. A vacuum is pulled in the chamber containing the IC chips and the film having the plates presses the lead frame into the adhesive wherein the adhesive is cured by a heat process. Weight may also be applied to the plates to perform the same function as does the vacuum. The purpose of the plates is to apply an even pressure to the lead frame and to maintain flatness of the lamination without bending the lead frame over the edge of the IC chip. The silicon film may be compressed, thus, allowing for different thickness IC chips while applying an even pressure across the face of the IC chips.

Yet another embodiment of the present invention uses a thin stainless steel plate having a thickness, for example, of 6 mils. The stainless steel plate is backed by a layer of high temperature RTV having a thickness, for example, of ⅛ inch. The RTV backing is further backed by soft rubber having a thickness, for example, of ½ inch. This stainless steel plate, RTV and soft rubber sandwich is placed over the lead frames aligned with the IC chip faces wherein the plate is in contact with the lead frames. A weight is placed on top of the sandwich, thus, applying pressure during the lamination process. The thin stainless steel plate has short term flatness and long term compliancy during the lamination process.

After the lead frame is laminated, the adhesive may be cured at 175 degrees centigrade for 30 minutes. This curing removes any solvents remaining in the B-staged adhesive and completes the cross linking of the molecular structure of the adhesive.

Next the lead frame may be connected to the IC connection pads by using wire bonding, wedge bonding, TAB or any other method of bonding. An advantage of wedge wire bonding is that the lead frame may be etched to have a thinner attaching frame at the IC, thus, a flatter lead frame chip connection may be achieved. This further reduces the overall thickness of the lead frame IC package.

After the lead frame is connected to the IC connection pads, a case is transfer molded onto the integrated circuit chip along with the lead frame attached thereto. The transfer molded case may be cured at 175 degrees centigrade for 4 hours. After the transfer molding operation is complete, the plastic integrated circuit package is deflashed, the leads trimmed from its carrier, the IC circuits are burned in and tested and finally the leads are formed, resulting in a level one integrated circuit package.

Still another embodiment of the present invention is a polypropylene adhesive carrier and fixture having pre-skived adhesive patches thereon placed in alignment with the IC chip alignment fixture wherein the patches of adhesive attached to the polypropylene carrier may be approximately 50 mils to 250 mils above the faces of the IC chips. The polypropylene carrier is stretched taught in its carrier fixture. The IC chips are heated to between 120 degrees and 140 degrees centigrade and a rubber blade or roller is moved from one end of the chip array to the other, pressing the adhesive patches onto the hot IC chip surface and transferring the adhesive to the IC chip faces. The IC chips are held in place by vacuum means while the polypropylene film moves back to its original horizontal position after leaving the adhesive patches stuck to the IC chip faces.

A further embodiment of the present invention is to apply adhesive to the lead frame by any of the methods described above. The adhesive may be laminated to the lead frame by applying it at a temperature, for example, of 120 degrees centigrade for about 5 seconds. The adhesive may be B-staged after lamination to the lead frame. A very thin lead frame may be used because the laminated adhesive adds stiffening and support to the delicately thin lead frame. In addition the adhesive is not cured to the point where it would shrink and cause warping of the lead frame.

The lead frame thickness may be reduced at the tips for an overall reduction in integrated circuit package thickness. The lead frame tip thickness may be reduced by etching or any other way known in the art of integrated circuit fabrication. A novel way of supporting the lead frame tips is to leave a bar of lead frame material attached to the ends of the tips, thus giving support and rigidity to the overall lead frame.

After the adhesive is laminated to a supported lead frame, the support bar may be punched out along with any adhesive attached thereto. By punching from the adhesive coated side of the lead frame, a slight angle may be put on the lead frame tips wherein the lead frame tips are angled away from the connection pads of the IC face after placement thereon. Very thin lead frames may be fabricated in this manner for easy handling during fabrication because the laminated B-staged adhesive adds rigidity to the overall lead frame, allowing less damage to the lead frame during the fabrication process.

The lead frame and laminated adhesive may be laminated to a bare IC chip face resulting in a single layer device. The IC chip face may have a layer of adhesive, by any of the methods described above, cured to act as an insulator then the lead frame with B-staged adhesive may be laminated to the insulator on the chip face. A preferred embodiment of a two layer system would have the adhesive laminated to the chip face covering slightly more area than the adhesive laminated to the supported lead frame. This prevents the tips of the lead frame from shorting to the IC chip.

A problem when closely placing IC packages together is removal of heat generated from the operation of the electronic circuit elements. The above embodiments of the present invention improve the thermal conductivity between the IC die and the lead frame, thus, allowing the lead frame to act more efficiently as an effective heat sink whether used with the normally thick encapsulated IC packages or the new ultra-thin packages.

DETAILED DESCRIPTION OF THE PREFERRED EMBODIMENT

Figure 1:
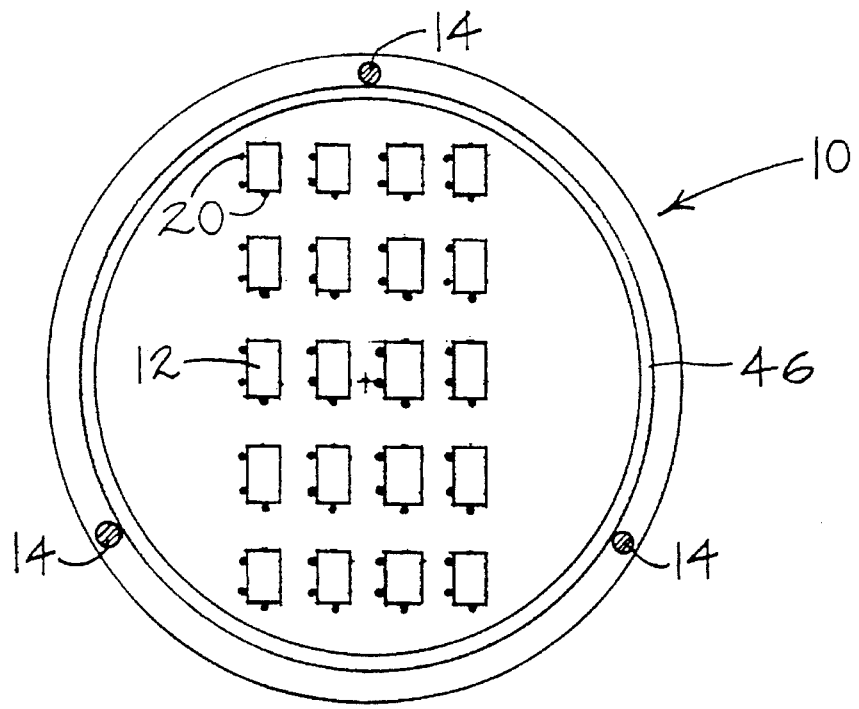
FIG. 1 illustrates an integrated circuit chip vacuum alignment fixture of the present invention in schematic top view.
Figure 3:
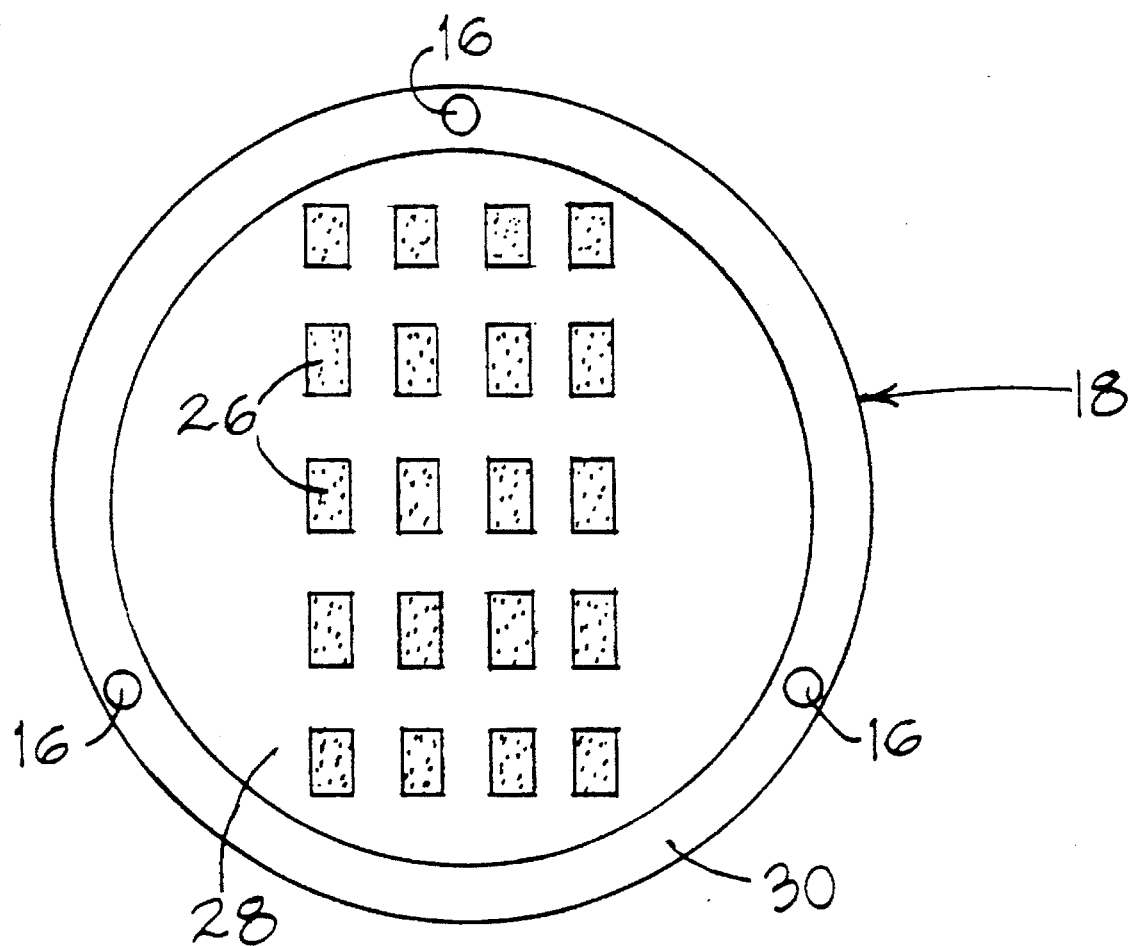
FIG. 3 illustrates an adhesive carrier alignment fixture in schematic bottom view.

A better understanding of the present invention can be had when the following detailed description is read with reference to the drawings wherein common elements are designated with like numbers or letters. Referring now to FIGS. 1 and 3, a top view of an IC chip alignment fixture 10 holding a plurality of IC chip dies 12 is schematically illustrated in FIG. 1. The chip alignment fixture 10 uses alignment pins 14 to insure proper alignment registration with guide holes 16 in adhesive carrier alignment fixture 18 during fabrication of the IC chip lead frame packages as illustrated in FIG. 3 and an O-ring seal 46.

Figure 2A:
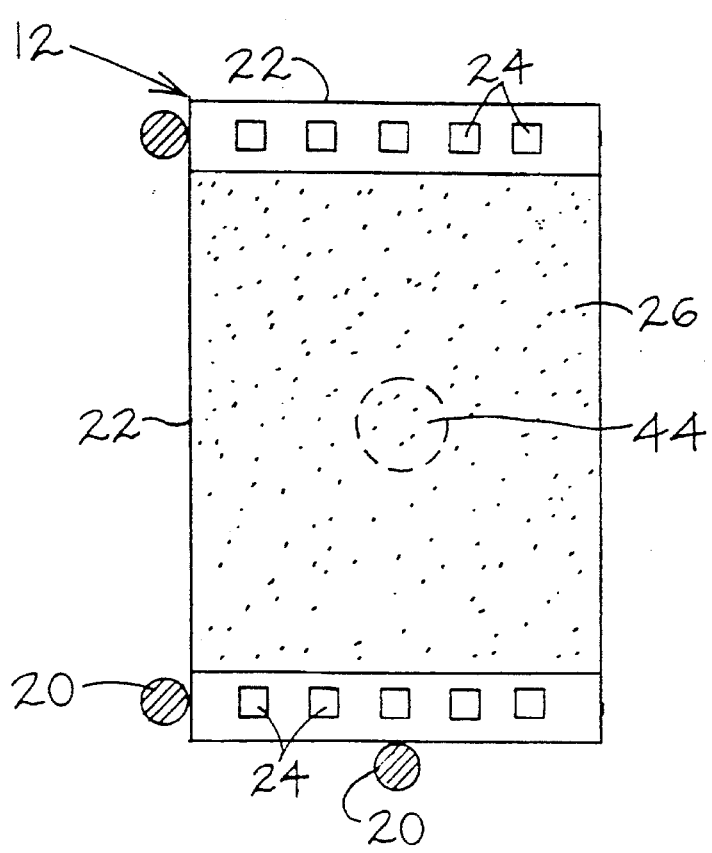
FIGS. 2a, 2b and 2c illustrate embodiments of an integrated circuit chip in schematic top view.
Figure 2B:
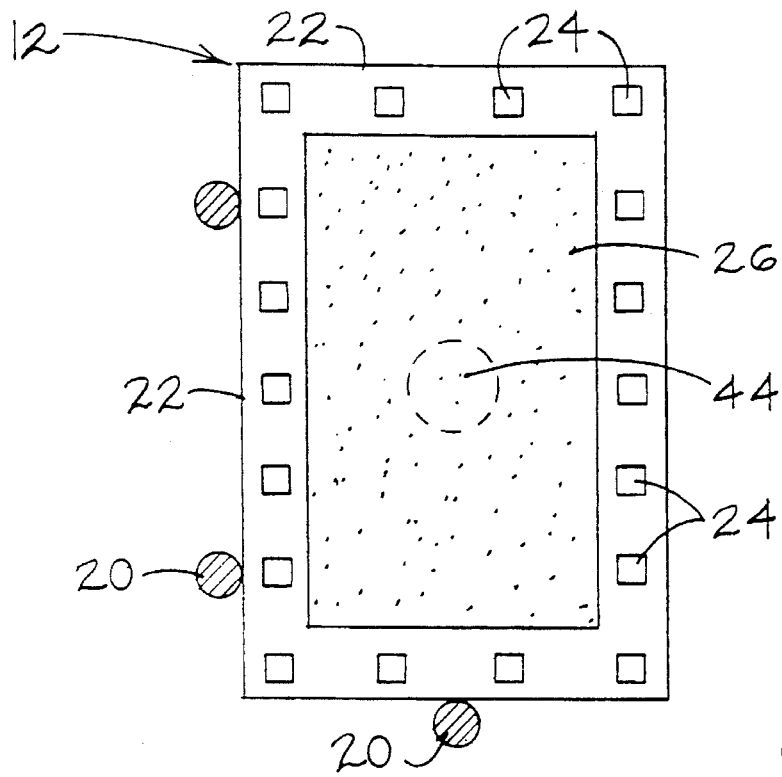
Figure 2C:
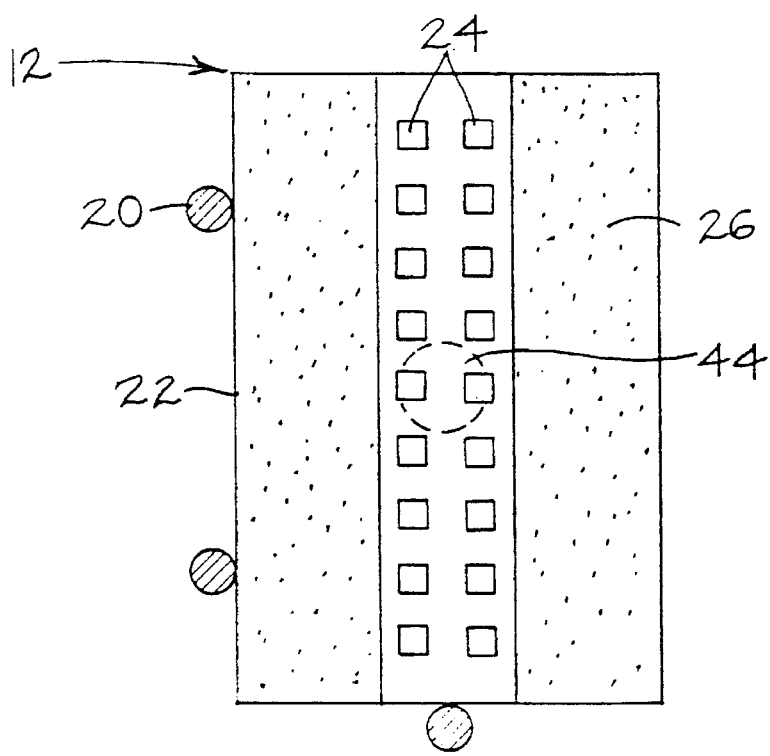

Referring now to FIGS. 2a, 2b and 2c, more detailed top views of typical IC chip dies 12 are schematically illustrated. The IC chips 12 are correctly oriented in alignment fixture 10 by alignment pins 20. The precision cut edges 22 of the IC chip 12 fit snugly between the pins 20, thus, maintaining correct alignment and accurate registration during the manufacturing process. The chips 12 are held to the alignment fixture 10 by vacuum means 44.

Referring now to FIG. 3, a bottom view of an adhesive carrier alignment fixture 18 is illustrated schematically. The fixture 18 comprises an alignment ring 30, and alignment guide holes 16 that fit over alignment pins 14 (FIG. 1) of chip alignment fixture 10. Ring 30 securely holds adhesive carrier 28 which may be, for example, polypropylene sheet 4 mils thick. Adhesive carrier 28 carries a plurality of adhesive patches 26 formed so as to align with the faces of the IC chip dies 12.

The adhesive carrier 28 may be manufactured with adhesive, such as B-staged epoxy, already coated onto the carrier 28. The adhesive may be coated onto the carrier 28 at whatever thickness is required. Presently, ¼ mil is the practical limit as to how thin the adhesive may be applied to the carrier 28. The carrier 28 supplies the physical strength to the carrier-adhesive combination. A suitable B-staged epoxy adhesive may be, for example, Rogers Corp. R/flex (R) 8970 which is a B staged phenolic butyryl epoxy.

The adhesive patches 26 are formed after the adhesive coated carrier 28 is fixed in the alignment ring 30 by skiving the adhesive coating. The adhesive coating of carrier 28 is selectively skived, without cutting through the polypropylene, into rectangular patches in size and position to match the IC chip dies 12. The adhesive coating may be skived so that the unneeded adhesive is left in one piece, thus, allowing the unneeded adhesive to be peeled away from the carrier 28 like dough from a cookie sheet. The adhesive patches 26 that remain on the carrier 28 are now in the proper shape and locations to be transferred to the faces of the IC chip dies 12 aligned in alignment fixture 10.

Figure 4A:
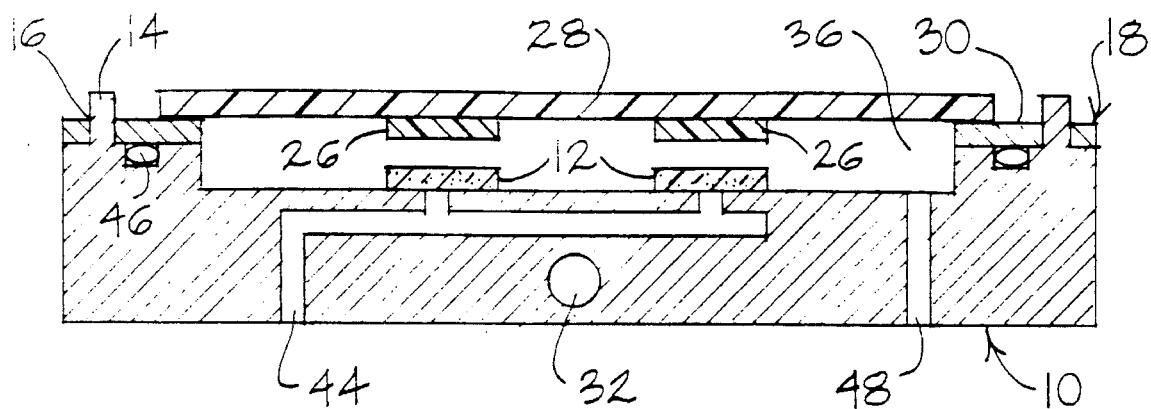
FIGS. 4a and 4b illustrates the preferred fabrication apparatus and method of the present invention in schematic sectional elevational views.
Figure 4B:
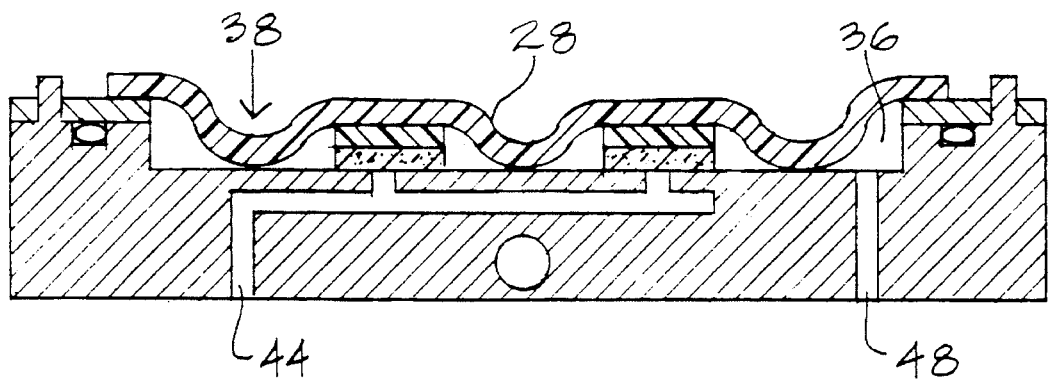

Referring now to FIGS. 4a and 4b, sectional elevational views of the chip alignment fixture 10 and adhesive carrier alignment fixture 18 mated together are illustrated schematically. Alignment fixture 18 sits on top of the IC chip alignment fixture 10 wherein the alignment pins 14 fit snugly into the guide holes 16. Thus, the adhesive patches 26 on adhesive carrier 28 attached to ring 30 are in proper registration with the IC chip dies 12. The adhesive carrier 28 may be, for example, 10 to 100 mils from the face of the IC chips 12, wherein the adhesive patches 26 are close to but not in communication with the faces of IC chips 12.

A heater 32 is used to heat the IC chips 12 to about 120–140 degrees centigrade in a chamber 36 formed by alignment fixtures 10 and 18. O-ring 46 keeps an air tight seal between the mating faces of fixtures 10 and 18. A vacuum is pulled in the chamber 36 through vacuum line 48. As the pressure in the chamber 36 decreases, adhesive carrier 28 moves toward the faces of IC chips 12. Movement of carrier 28 is caused by atmospheric pressure 38 pressing the elastic polypropylene sheet adhesive carrier 28 toward the lower pressure in chamber 36, as schematically illustrated in FIG. 4b. Another embodiment of the present invention uses air pressure greater than the pressure in the chamber 36 to push the carrier 28 toward the IC chips ultimately pressing the adhesive onto the faces of the IC chips.

Movement of carrier 28 causes the surface of the adhesive patches 26 to touch the faces of IC chips 12. The adhesive 26 will stick to IC chip 12 and remain thereon because of the elevated temperature of the IC chip. After all of the adhesive patches 26 are attached to the IC chips 12, carrier 28 may be removed by cutting it from ring 30 and peeling it off.

The adhesive patches 26 remain on the faces of IC chips 12 because the heated surface of the chips 12 cause the adhesive patches 26 to more firmly attach to the chips 12 than to carrier 28 and the chips 12 are held to the fixture 10 by vacuum means 44. Thus, when carrier 28 is peeled away, the adhesive patches 26 remain on the IC chips 12. The adhesive patches 26 are also in proper alignment to cover only the required portion of the faces of IC chips 12.

Figure 5A:
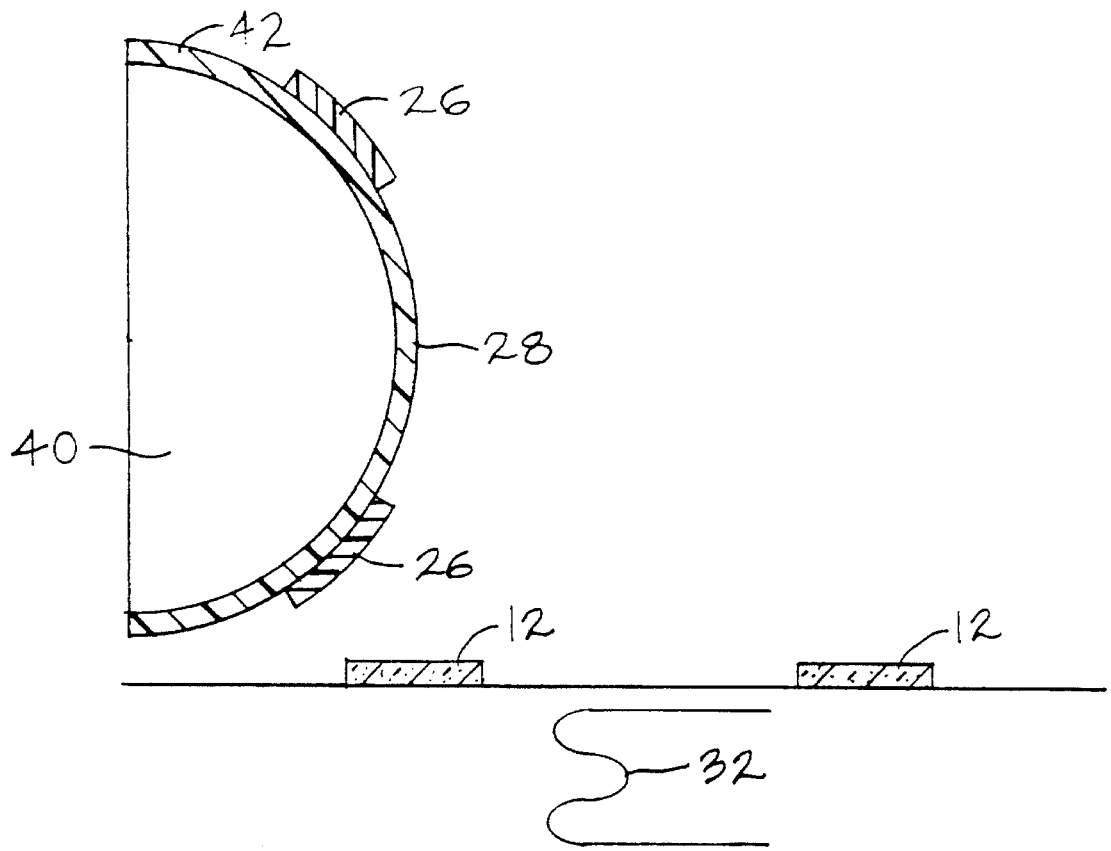
FIGS. 5a, 5b and 5c illustrate other preferred fabrication apparatus and methods of the present invention in schematic elevational views.
Figure 5B:
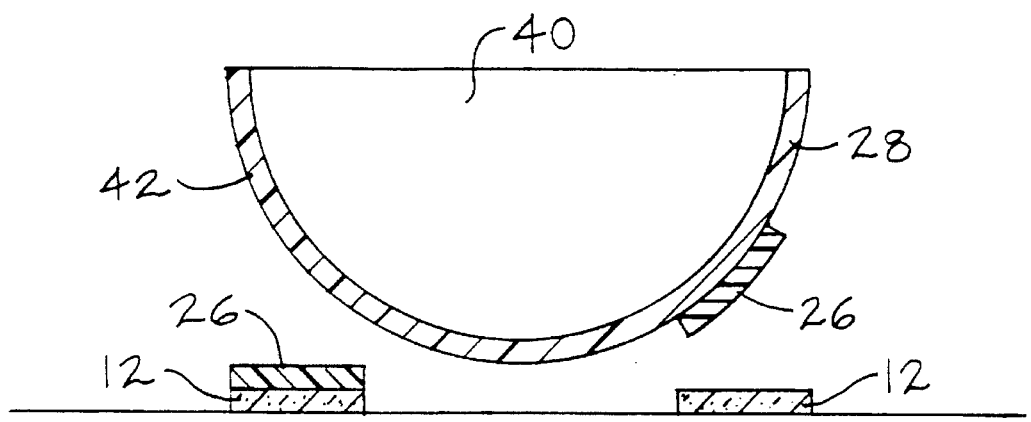

Another embodiment that may transfer the adhesive patches 26 to the IC chips 12 is illustrated schematically in FIGS. 5a and 5b. Referring now to FIGS. 5a and 5b, an elevational view of a half-circular roller 40 is illustrated schematically. The roller 40 has a polypropylene carrier 28 having adhesive patches 26. The carrier 28 is attached to the roller 40 face surface 42 wherein the patches 26 are of the correct size, shape and location for proper registration with the IC chips 12.

The IC chips 12 are heated by the heater 32 to a temperature between 120–140 degrees centigrade. Next, the roller 40 mechanically transfers the patches 26 from the carrier 28 attached to surface 42 to the faces of IC chips 12 (FIG. 5b). The roller 40 is aligned in relation to chip alignment fixture 10 and maintains correct registration for the adhesive patches 26 with IC chips 12. An advantage in using the roller 40 is that air bubbles are eliminated and the step of peeling off an adhesive carrier is not required.

Figure 5C:
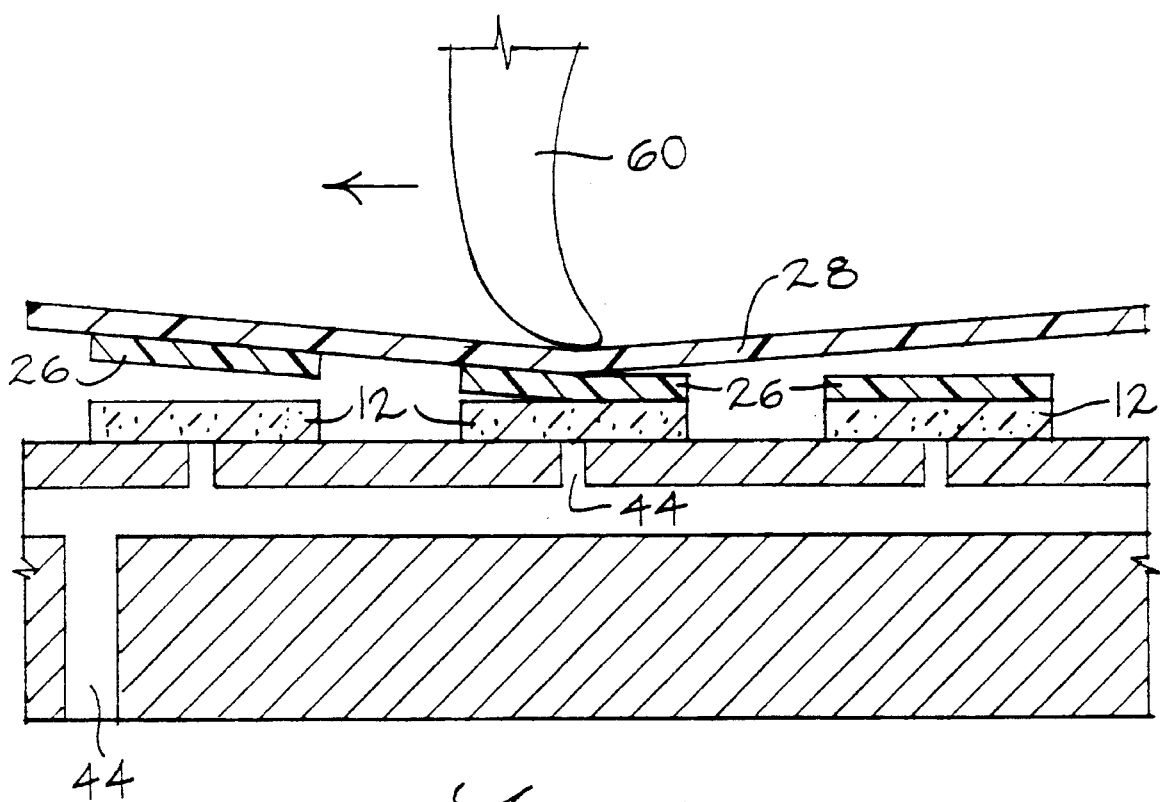

Referring now to FIG. 5(c), a knife 60 pushes carrier 28 toward the faces of IC chips 12 wherein adhesive 26 transfers to the faces of chips 12, thus, leaving the carrier 28. The chips 12 are held in place by vacuum means 44. The polyimide adhesive 28 may be quartz filled which improves the thermal conduction of the adhesive layer. In transferring the adhesive onto the faces of the IC chips 12, the IC chip interconnection pads remain free of the adhesive. If the polyimide is properly B-staged then a second layer of adhesive may not be required because the first layer will insulate and space the lead frame 50 from the face of the IC chip 12.

The vacuum transfer method illustrated in FIGS. 4a and 4b, the roller method illustrated in FIGS. 5a and 5b, and the knife edge method of FIG. 5c or any combination thereof may be used to practice the present invention and other methods of transfer may be apparent to those skilled in the art.

Figure 6A:
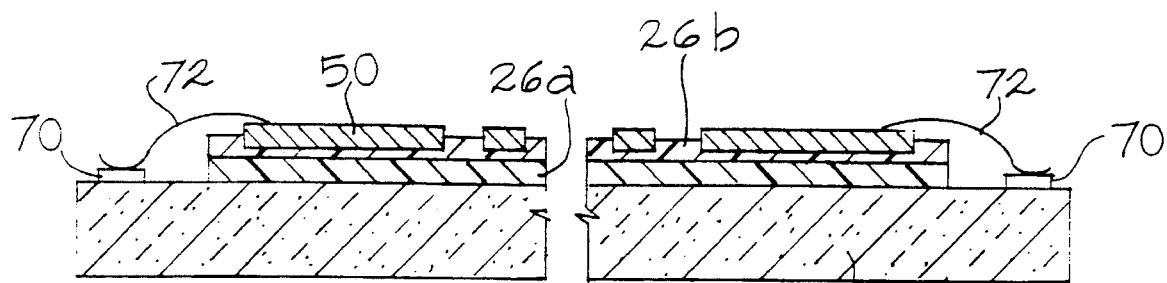
FIGS. 6a, 6b, 6c illustrate schematic elevational views of a two adhesive layer embodiment of the present invention.
Figure 6B:
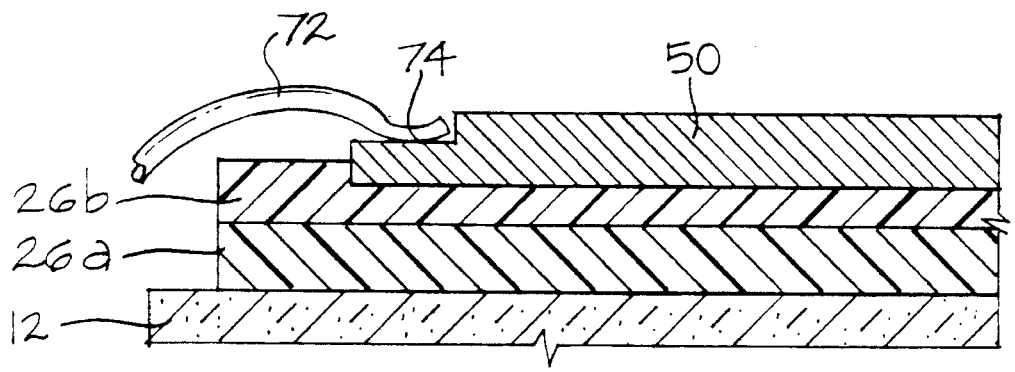
Figure 6C:
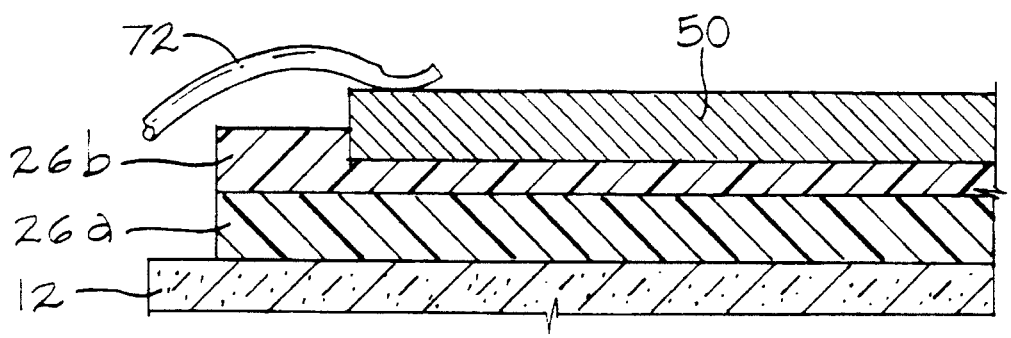

Referring now to FIGS. 6a, 6b and 6c, elevational views of a two adhesive layer embodiment of the present invention are schematically illustrated. A first adhesive layer 26a is transferred onto IC chip 12 in a manner described above then cured. The cured layer 26a spaces and insulates the face of IC chip 12 from a lead frame 50, thus, preventing the lead frame 50 from contacting the transistor circuits exposed on the face of the IC chip 12.

Figure 9:
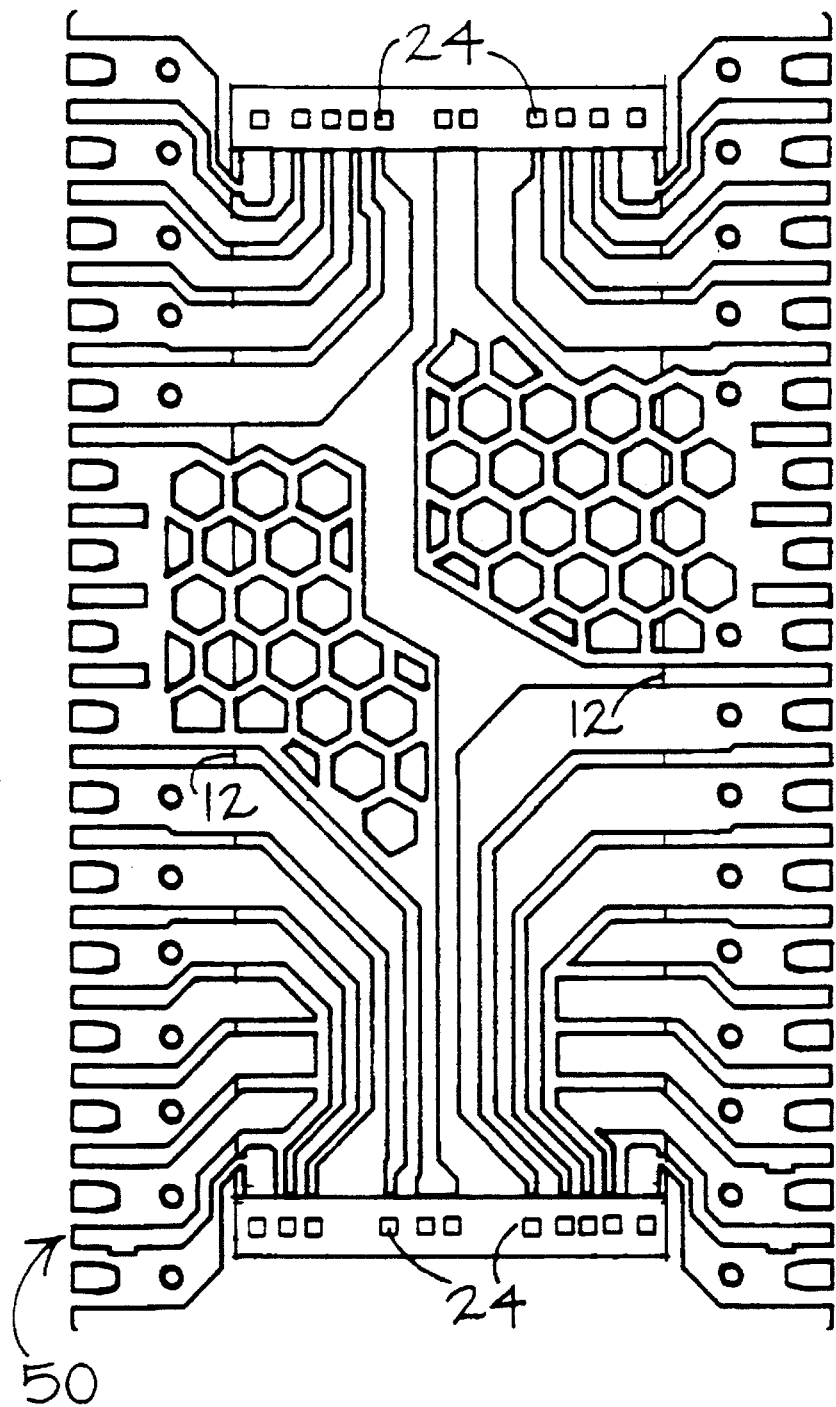
FIG. 9 illustrates a schematic top view of the embodiments illustrated in FIGS. 6a, b, c, 7, 8a and b.

A second adhesive layer 26b is transferred onto the cured first layer 26a in a manner described above. The second layer 26b is used to fixedly attach the lead frame 50 to the face of IC chip 12. The lead frame 50 may be laminated to the second layer adhesive 26b by means of flat plates 80 (FIGS. 10 and 11) backed with flexible silicon 84 and weights 86 or any other means that may control the flatness and pressure applied in setting the lead frame 50 into the second layer adhesive 26b. Once the lead frame 50 is securely set in adhesive 26b, the lead frame 50 may be TAB, wire or wedge bonded to the IC pads 24 (FIG. 9). FIG. 6b schematically illustrates the edge of lead frame 50 being etched so as to reduce the overall thickness of the IC package in ultra thin applications. Etched step 74 in lead frame 50 has wire bond lead 72 attached thereto. Lead 72 connects to IC connection pad 70 making up the electrical connection from the IC circuits to the lead frame 50 (FIG. 6a). FIGS. 6a and 6c schematically illustrate various methods of attaching conductors to the lead frame 50. The lead frame 50 may be etched thinner at etched step 74 which connects to the IC circuit connection pads 70. The thickness of lead frame 50 may be 3 mils for connections to outside circuits not part of the IC package, however, the lead frame 50 connections for wire bonding to the internal IC connection pads may be 1.5 mils. Reducing the thickness of the lead frame 50 at wire bond leads 72 within the IC package aids in obtaining a thinner and flatter level one package.

Figure 7:
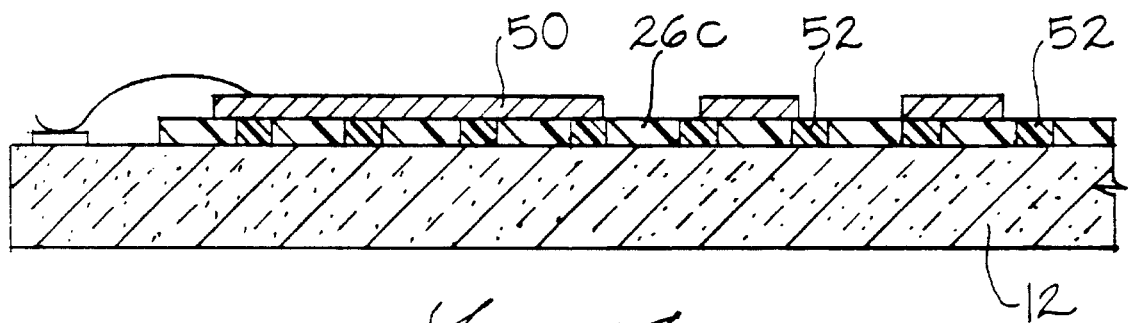
FIG. 7 illustrates another embodiment of the present invention in schematic elevational view.

Referring now to FIG. 7, an elevational view of a single adhesive layer embodiment of the present invention is schematically illustrated. A layer of adhesive 26c is transferred onto IC chip 12 in a manner described above. The adhesive layer 26c has previously been cured at selected locations by means of a laser (not shown) to form spacing insulators 52. The spacing insulators 52 space and insulate the face of IC chip 12 from the lead frame 50, thus, preventing the lead frame 50 from contacting the transistor circuits exposed on the face of the IC chip 12.

The uncured part of adhesive layer 26c is used to fixedly attach the lead frame 50 to the face of IC chip 12. The lead frame 50 may be set into the adhesive 26c by means of flat plates of glass or stainless steel and weights or any other means that may control the flatness and pressure applied in setting the lead frame 50 into the adhesive 26c. Once the lead frame 50 is securely set in adhesive 26c, the lead frame 50 may be TAB, wire or wedge bonded to the IC pads 24 (FIG. 9). This is the single layer embodiment of the present invention.

Figure 8A:
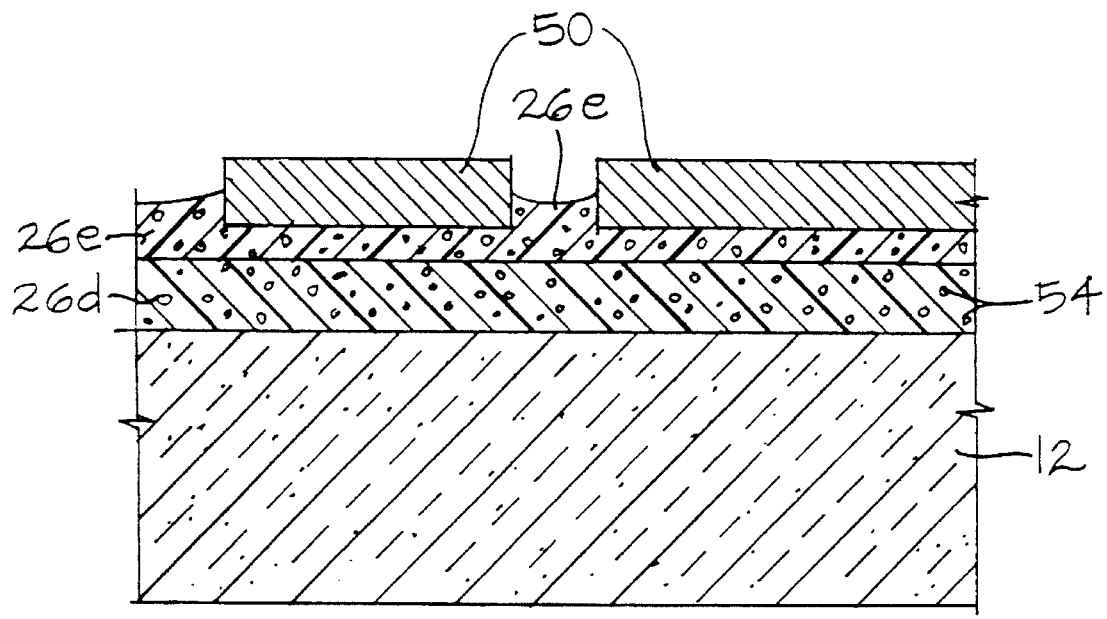
FIGS. 8a and 8b illustrate additional embodiments of the present invention in schematic elevational view.
Figure 8B:
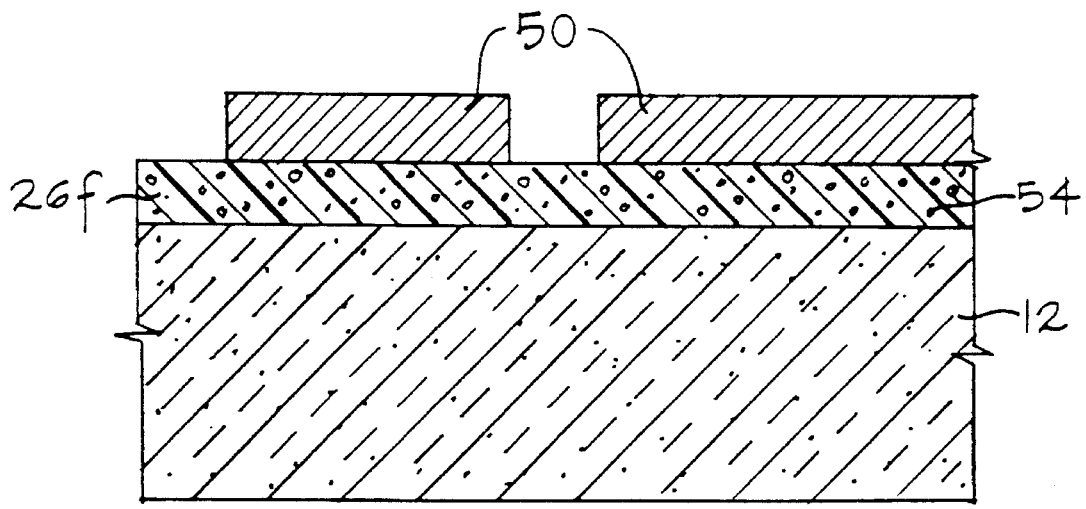

Referring now to FIGS. 8a and 8b, elevational views of two adhesive layer and single layer embodiments, respectively, having thermally conductive filler, such as fused silica, are schematically illustrated. A first adhesive layer 26d having thermally conductive filler 54 is transferred onto IC chip 12 in a manner described above then cured. The cured filled layer 26d spaces and insulates the face of IC chip 12 from a lead frame 50, thus, preventing the lead frame 50 from contacting the transistor circuits exposed on the face of the IC chip 12. The thermally conductive filler 54 acts as an insulator and spacer in addition to improving thermal conduction between the electronic circuits of the IC chip 12 and the lead frame 50.

A second adhesive layer 26e having thermally conductive filler 54 is transferred onto the cured first layer 26d in a manner described above and B-staged cured. The second layer 26e is used to fixedly attach the lead frame 50 to the face of IC chip 12. The thermally conductive filler 54 improves thermal conduction in layer 26e, thus, improving the thermal conduction between the electronic circuits of the IC chip 12 and the lead frame 50. The lead frame 50 may be set into the second layer adhesive 26e by means of flat plates and weights or any other means that may control the flatness and pressure applied in setting the lead frame 50 into the second layer adhesive 26e. Once the lead frame 50 is securely set in adhesive 26e, the lead frame 50 may be TAB, wire or wedge bonded to the IC pads 24 (FIG. 9). A single layer of adhesive 26f (FIG. 8b) may be used for both the insulator and to set the lead frame onto the IC chip face. Adhesive 26f may have insulating spacers 52 (FIG. 7) formed within as described above by laser, electron beam or any other method of selective curing know in the art. Thermally conductive filler 54 may also be used as insulating spacers. The above embodiments of the present invention improve the thermal performance of the IC package such that the junction temperatures of the transistors and diodes of the IC are reduced, thus, increasing the operating life with a corresponding improvement in reliability of the IC device.

Figure 10:
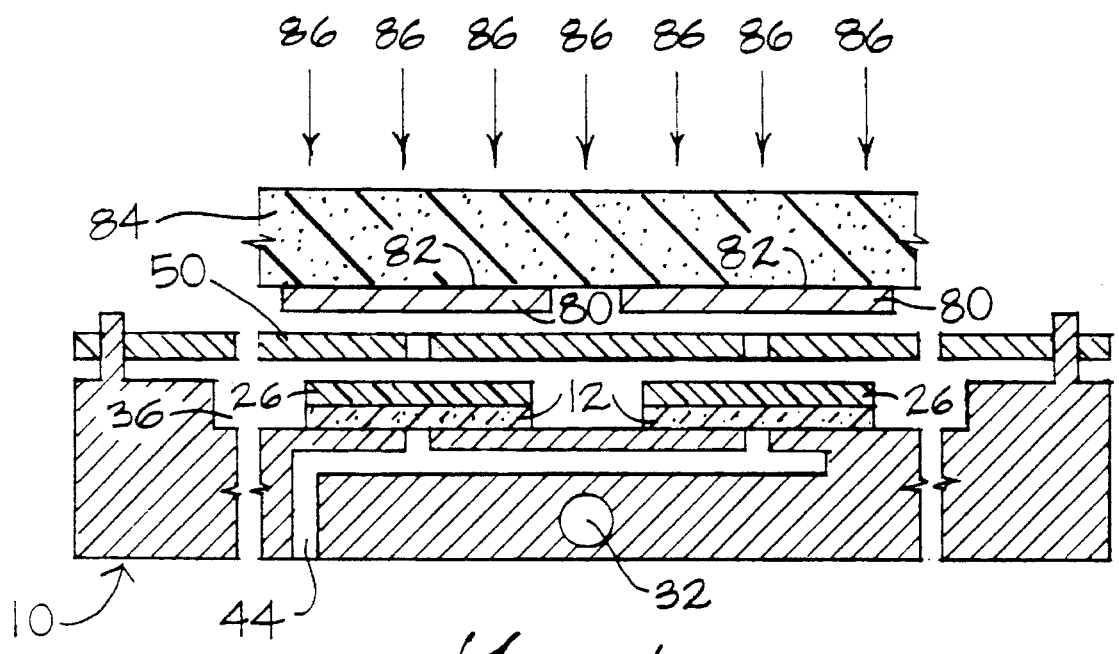
FIGS. 10 and 11 illustrate schematic elevational views of a preferred embodiment of the present invention.
Figure 11:
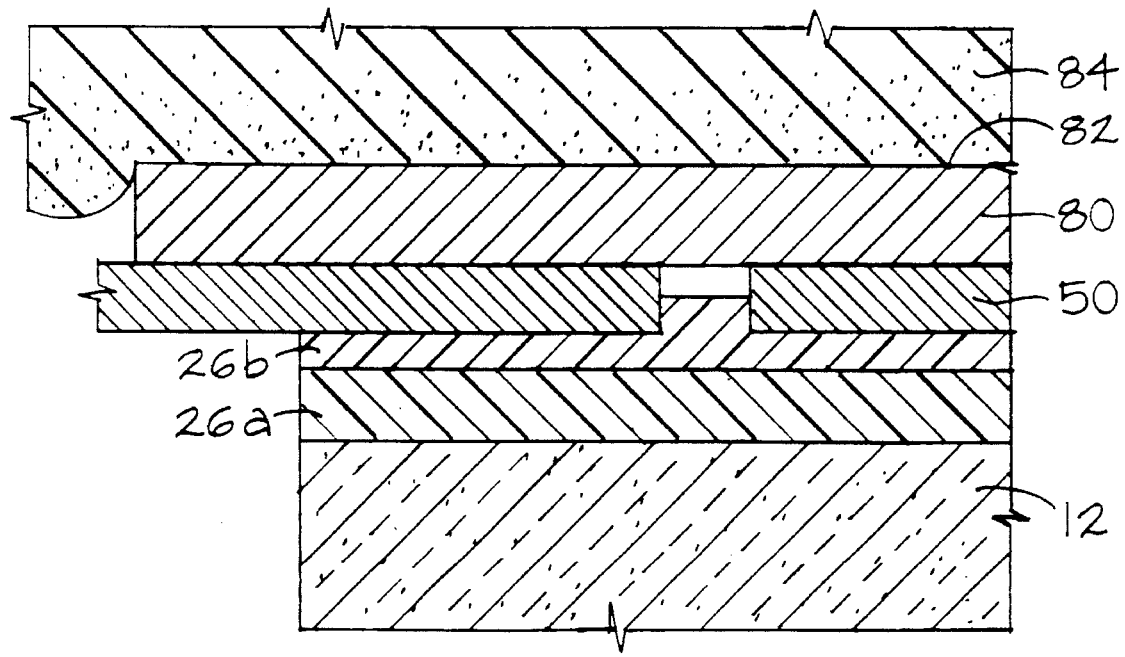

Referring now to FIGS. 10 and 11, elevational views of a method of laminating the lead frame 50 to the adhesive 26 are schematically illustrated. Chips 12 are held in fixture 10 by vacuum means 44 where the lead frames 50 are aligned with the faces of the chips 12. Once aligned, lead frames 50 are laminated to the chips 12 by being pressed into the adhesive 26 by pressure exerted by flat plates 80 glued to soft RTV silicon pad 84 by a layer 82 of thin silicon glue. The pressure exerted from silicon pad 84 results from downward force of weights 86. The downward force may be from a flat plate weight, air pressure or creation of a vacuum in chamber 36. Any gentle even force may be used to create a pressure on plates 80 which cause lead frame 50 to evenly laminate into adhesive 26. Use of plate 80 allows an even distribution of pressure across the entire surface of lead frame 50 while the lamination and curing process occurs. An enlarged elevational view of pad 84, plate 80, lead frame 50, first layer adhesive 26a, second layer adhesive 26b, and chip 12 is schematically illustrated. Pad 84 may compress under weight 86 allowing an even distribution of force upon plate 80 which causes lead frame 50 to laminate into second layer adhesive 26b in a mostly flat fashion. Using plate 80 prevents uneven lamination pressure from cracking an ultra thin chip 12 and also results in an even and level lamination of the lead frame 50 onto the face of chip 12.

Figure 12:
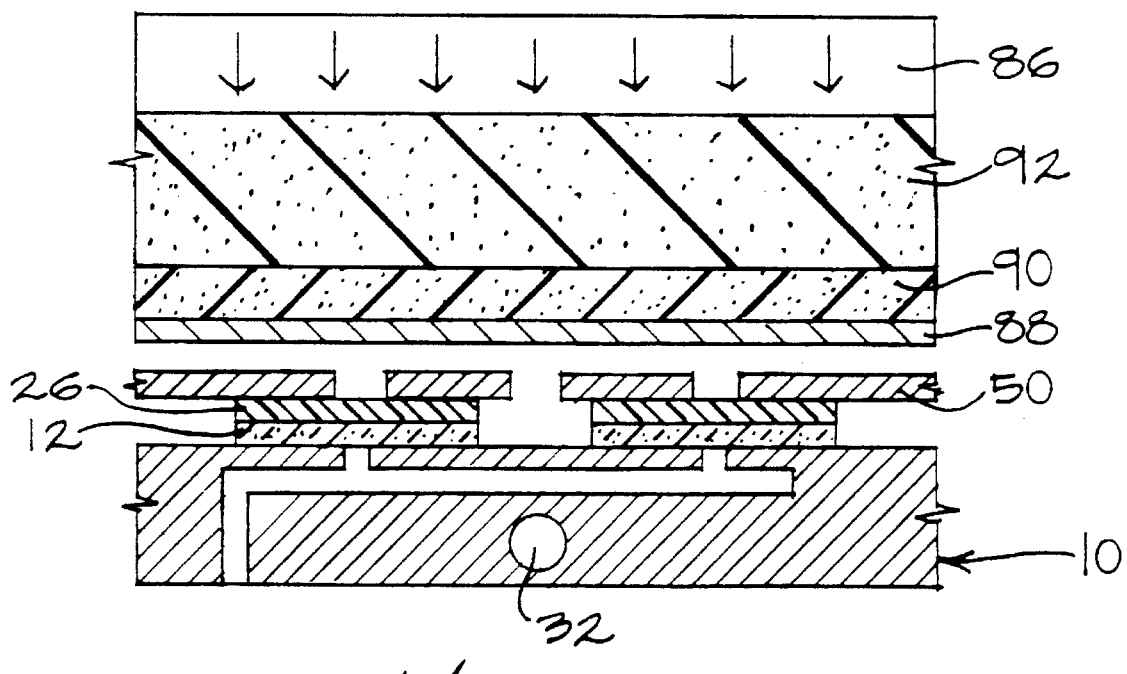
FIG. 12 illustrates a schematic elevational view of a preferred embodiment of the present invention.

Referring now to FIG. 12, an elevational view of a lead frame lamination method is schematically illustrated. Lead frames 50 have been aligned with and placed over the faces of IC chips 12. Adhesive 26 is ready to be cured, thus, fixedly attaching the lead frames 50 for subsequent bonding to the IC chip 12 pads. A sandwich comprised of thin stainless steel plate 88, high temperature RTV 90 and soft rubber 92 is placed on top of the lead frames. A weight 86 is placed on top of the sandwich, thus, placing pressure through rubber 92, RTV 90 and plate 88 onto the lead frames 50. It is important that the pressure applied to the lead frames 50 be uniform, even and level across the face of each IC chip 12. The lead frames 50 must remain flat on the adhesive 26 and not be bent over the edge of the IC chips 12 during the lamination process. Each IC chip 12, however, may have a slightly different thickness, therefore, the plate 88 must be able to conform to the slightly uneven topography represented by the uneven in thickness IC chips 12.

The stainless steel plate 88 may have a thickness of 6 mils. This thickness allows the plate 88 to maintain a localized rigidity or stiffness, but to have an overall compliancy that will adapt to the variations in the height of the IC chips 12. The RTV 90 layer is used as a high temperature backing for plate 88 and aids in localizing rigidity but maintaining an overall compliancy. The soft rubber 92 is used as a backing and for more even distribution of weight 86. The sandwich applies pressure to the lead frames 50 while temperature is applied, by means of heater 32, to IC chips 12. After the adhesive 26 cures the sandwich may be removed and reused for the next lamination process.

Figure 13:
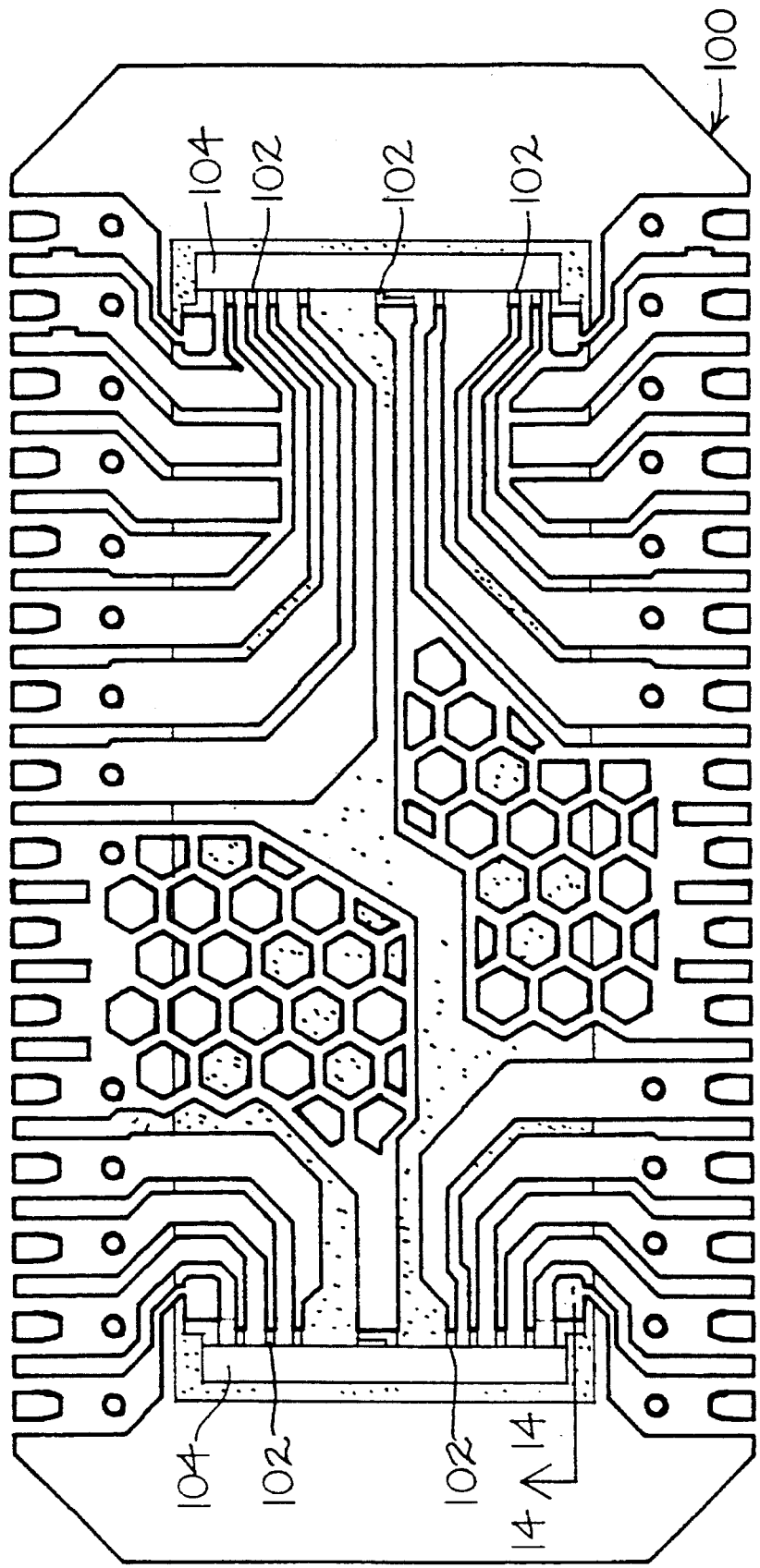
FIG. 13 illustrates a schematic top view of an embodiment of a supported lead frame of the present invention.

Referring now to FIG. 13, a supported lead frame is illustrated schematically in top view. A supported lead frame 100 has tips 102 attached to a support bar 104. The support bar 104 keeps the tips 102 in alignment and prevents deformation during handling. This is important for maintaining alignment of the lead frame when used in automated tape bonding equipment and results in improved yields during the integrated fabrication process. An embodiment of the present invention laminates adhesive 26 by any of the techniques described above. Laminating adhesive 26 to the lead frame 100 also helps stiffen and support the tips 102.

The support bar 104 may be removed by punching or cutting the bar 104 from the tips 102. Placing a slight bend on the tips 102 during the punching or cutting process prevents the lead frame from shorting to the face of the IC. The adhesive 26 is B-staged during lamination to the lead frame 100 by applying at a temperature, for example, of 120 degrees centigrade for 5 seconds. After the adhesive 26 is laminated to the lead frame 100 and the support bar 104 is removed from tips 102 the lead frame and laminated B-staged adhesive may be laminated to either an uninsulated face of an IC or to a cured layer of adhesive acting as an insulator on the face of the IC.

Figure 14:
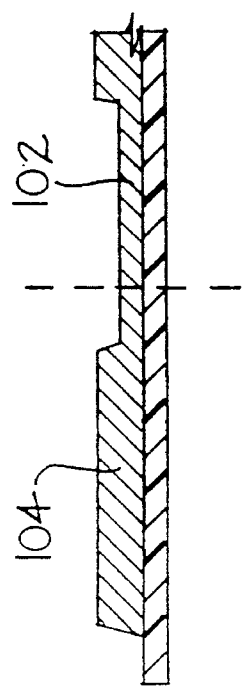
FIG. 14 illustrates a cross sectional view of the embodiment illustrated in FIG. 13 taken along line 14—14.

FIG. 14 illustrates a cross section of the supported lead frame 100 having thinner tips 102. The tips 102 may be etched to a thickness less than the overall lead frame 100. This improves the overall IC package thickness because the connection of etched tips 102 to the connection pads 24 of the IC chip 12 may be made in less space.

Figure 15:
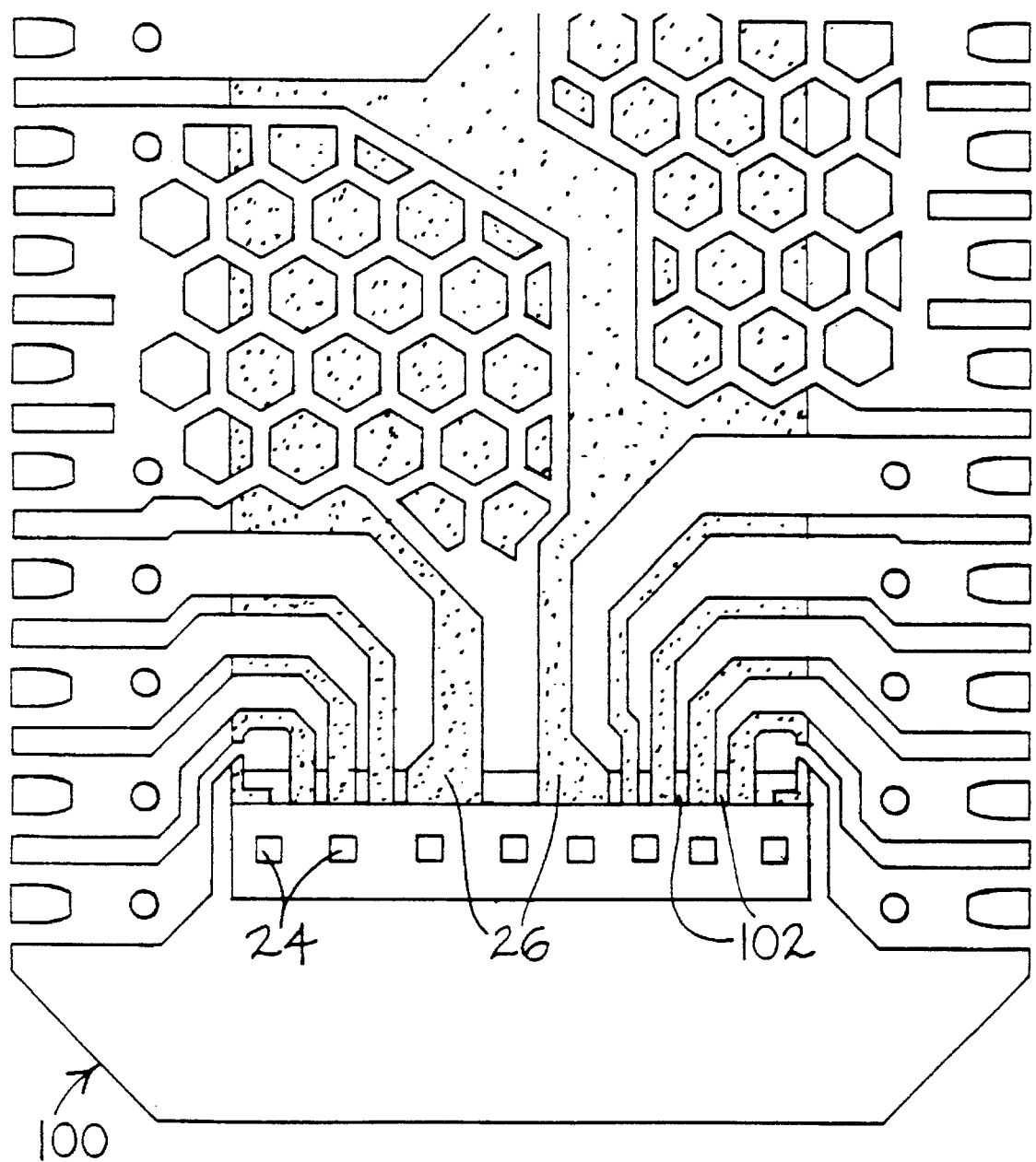
FIG. 15 illustrates a schematic top view of the embodiment illustrated in FIG. 13 after the lead frame support bar is removed.

FIG. 15 illustrates the supported lead frame 100 in schematic plan view. The support bar 104 (FIG. 13) has been removed from the lead frame tips 102. The adhesive 26 is cut flush with the ends of the tips 102. After the lead frame 100 is laminated to IC chip 12 the tips 102 may be connected to pads 24 as described above.

After the lead frame is laminated by any of the aforementioned methods, the adhesive may be cured at 175 degrees centigrade for 30 minutes. This curing removes any solvents remaining in the B-staged adhesive and completes the cross linking of the molecular structure of the adhesive.

Figure 16A:
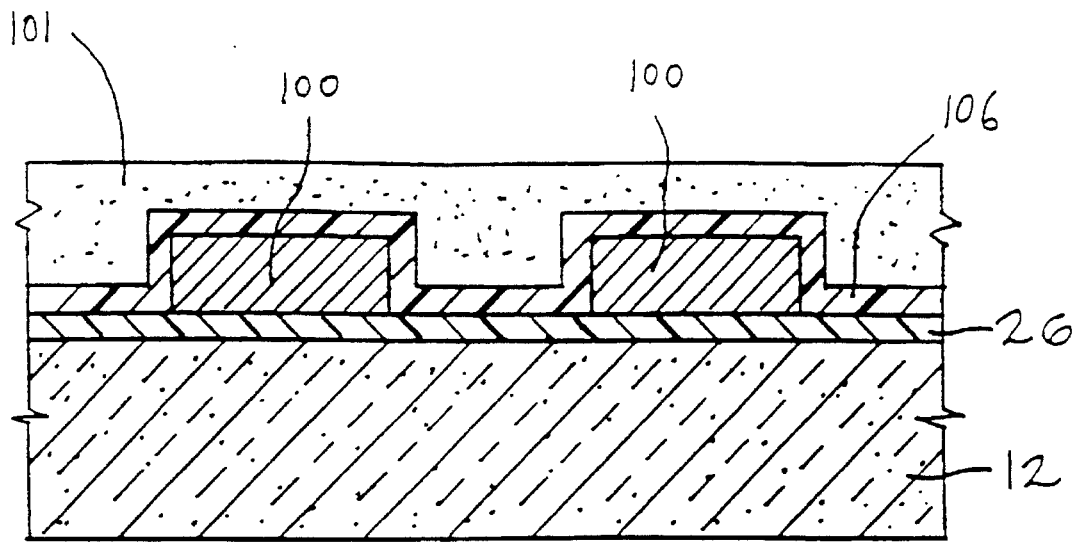
FIGS. 16a and 16b illustrate yet another embodiment of the present invention in schematic elevational view.

FIG. 16a illustrates an elevational cross section of yet another embodiment of the present invention. The lead frame 100 may be covered on top by encapsulating adhesive 106. The adhesive layer 26 covers the face of chip 12 whereby lead frame 100 is attached thereto and insulated therefrom. The encapsulating adhesive 106 covers the lead frame 100 except on its tips and adheres to the adhesive 26 which is cured to form an insulator on the face of the IC chip 12. The adhesive 26 is preformed so as not to cover the connection pads of the IC chip 12.

The adhesive 26 may be applied to the face of the IC 12 as described above, or may be laminated to the lead frame so as to support the lead frame during the fabrication process. The encapsulating adhesive 106 is applied to the lead frame 100 and may also be used to support the lead frame during the fabrication process. Additionally, adhesives 26 and 106 may be applied to the lead frame 100 as described above and the resulting sandwich may be laminated to the bare face of the IC chip 12.

In order to make the top layer adhesive 106 conform to the lead frame 100 on top of the face of the IC chip 12, an additional non-stick compliant layer must be interposed between the previously described lamination apparatus. This additional layer may be, for example, a 1 mil thick non-stick polypropylene or teflon film against adhesive layer 106 and a 20 mil soft RTV layer between the non-stick film and the lamination apparatus above (FIGS. 10–12). The non-stick film prevents the laminating device from sticking to the adhesive 106 while allowing compression of the adhesive 106 down between the lead frame onto the adhesive 26 thus encapsulating the lead frame 100.

Figure 16B:
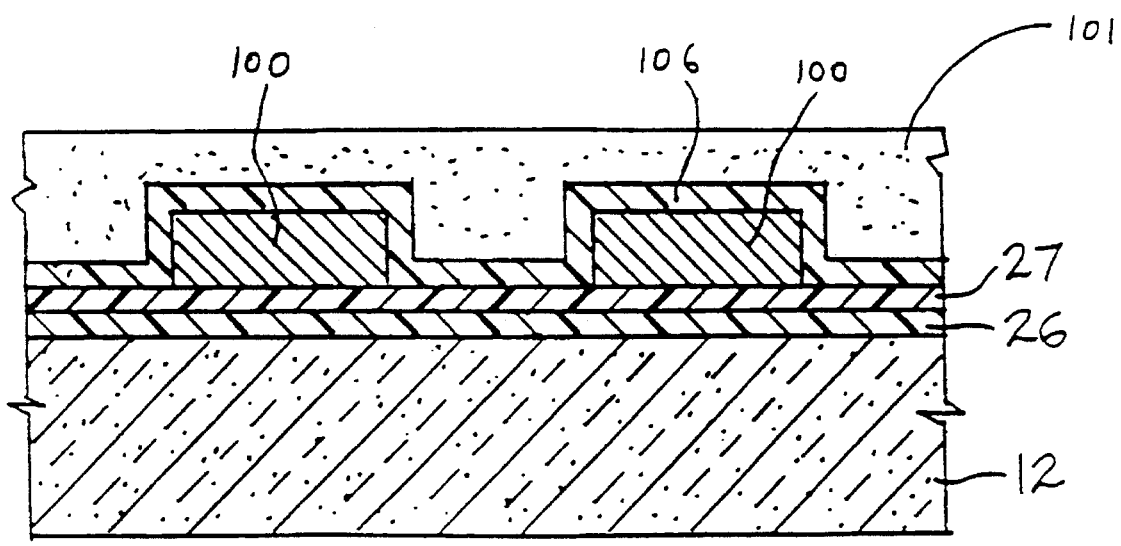

FIG. 16b illustrates yet another embodiment of the present invention where the lead frame 100 is preprocessed with two adhesive layers 106 and 27 prior to removing the supporting bar 104 (FIG. 13) and laminating to adhesive layer 26 on the face of the IC chip 12. Layers 106 and 27 may be on the top and bottom faces of the lead frame 100, respectively.

A preferred embodiment of this sandwich would have the adhesive 27 applied to the face of the lead frame facing the face of the IC chip 12 and the encapsulating adhesive 106 applied to the face opposite. The patch size of the adhesive 106 would be shaped so as to allow the tips 102 of the lead frame 100 to remain exposed, whereas the patch size of the adhesive 26 would be shaped so as to only allow the IC chip 12 connection pads 24 to be exposed. As described above, when the support bar 104 is removed from the tips 102 so is the adhesive 26 removed therefrom. In all embodiments disclosed herein, the bonding (connection) pads 24 (FIGS. 2a–2c) of the I.C. chip 12 and the lead frame 100 tips 102 (FIG. 13) are exposed to allow electrical connection of the connection pads 24 to the lead frame tips 102 by bonding as disclosed above After the lead frame 100 is connected to the IC connection pads 24, a case 101 encapsulates the integrated circuit chip along with the lead frame attached thereto. The encapsulating case 101 may be cured at 175 degrees centigrade for 4 hours. After curing the case 101 encapsulation, the plastic integrated circuit package is deflashed, the leads trimmed from its carrier, the IC circuits are burned in and tested, and the leads are formed. This completes the manufacture of a level one integrated circuit package.

The foregoing disclosure and description of the invention are illustrative and explanatory of the preferred embodiments, and changes in the size, shape, materials and individual components, circuit elements, connections and construction may be made without departing from the spirit of the invention.

What is claimed is:

1. A lead-on-chip integrated circuit package having good thermal conductivity for efficient transfer of heat contained therein comprising:

an integrated circuit chip having a face with circuit connection pads thereon;

a layer of adhesive having a plurality of spacing insulators therein, said adhesive on the face of said integrated circuit chip wherein the circuit connection pads are exposed;

a lead frame having a plurality of electrical conductors, said lead frame laminated to said adhesive and fixedly aligned with said integrated circuit connection pads for connection thereto, wherein said plurality of spacing insulators prevents said lead frame from shorting to said integrated circuit chip; and an encapsulating case surrounding said integrated circuit chip and lead frame.

2. The integrated circuit of claim 1, manufactured by a method comprising the step of: forming said spacing insulators by curing the adhesive at selected locations by means of a laser.

3. The integrated circuit of claim 1, manufactured by a method comprising the step of: forming said spacing insulators by curing the adhesive at selected locations by means of an electron beam.

4. The integrated circuit of claim 1, manufactured by a method comprising the step of: forming said spacing insulators by curing the adhesive at selected locations by means of infrared light through a mask.

5. A lead-on-chip integrated circuit package having good thermal conductivity for efficient transfer of heat contained therein comprising:

an integrated circuit chip having a face with circuit connection pads thereon;

a layer of insulation having adhesive on both faces;

a supported lead frames, which includes said layer of insulation laminated to said lead frame, said lead frame also having a plurality of electrical conductors each having a tip adapted for connection thereto, the tips bent so as to prevent shorting to the face of said integrated circuit chip;

wherein said adhesive of said layer of insulation supporting said lead frame is B-staged, and said tips of said supported lead frame remain exposed;

wherein said supported lead frame with said laminated layer of insulation, and said integrated circuit chip, are laminated together, wherein said lead frame tips are fixedly aligned with said exposed integrated circuit connection pads for connection thereto; and an encapsulating case surrounding said integrated circuit chip and supported lead frame.

6. The integrated circuit of claim 5, wherein said insulation is filled with thermally conductive and electrically insulating material.

7. A lead-on-chip integrated circuit package having good thermal conductivity for efficient transfer of heat contained therein comprising:

an integrated circuit chip having a face with circuit connection pads thereon;

a first layer of adhesive on the face of said integrated circuit chip wherein the circuit connection pads are exposed;

a lead frame having a plurality of electrical conductors, said lead frame laminated to said first layer of adhesive and fixedly aligned with said integrated circuit connection pads for connection thereto;

a second layer of adhesive on said lead frame, said second layer of adhesive encapsulating said lead frame to said first layer of adhesive; and an encapsulating case surrounding said integrated circuit chip and lead frame.

8. An integrated circuit package having good thermal conductivity for efficient transfer of heat contained therein, comprising:

an integrated circuit chip having a face with circuit connection pads thereon;

a first layer of adhesive on the face of said integrated circuit chip, wherein said circuit connection pads are exposed;

a lead frame having a first and a second major surface and having a plurality of electrical conductors, said first major surface of said lead frame laminated to said first layer of adhesive, wherein said lead frame is fixedly aligned with said integrated circuit connection pads for connection thereto; and a second layer of adhesive laminated to said second major surface of said lead frame, wherein said second layer of adhesive at least partially surrounds said lead frame and is in adhesive contact with said first layer of adhesive.

9. An integrated circuit package having good thermal conductivity for efficient transfer of heat contained therein, comprising:

an integrated circuit chip having a face with circuit connection pads thereon;

a layer of adhesive having a plurality of spacing insulators disposed therein, said adhesive being on said face of said integrated circuit chip, wherein said circuit connection pads are exposed; and a substantially planar lead frame having a plurality of electrical conductors, said lead frame laminated to said adhesive layer and fixedly aligned with said integrated circuit connection pads for connection thereto, wherein said plurality of spacing insulators prevent said lead frame from contacting said integrated circuit chip.

10. An integrated circuit package having good thermal conductivity for efficient transfer of heat contained therein, comprising:

an integrated circuit chip having a face with circuit connection pads thereon;

a layer of insulation having a first and a second side and having adhesive on both sides;

a supported lead frame, which includes said layer of insulation laminated to said lead frame, said lead frame also having a plurality of electrical conductors each said conductor having a tip, said tips bent so as to prevent contacting the face of said integrated circuit chip;

wherein said adhesive of said layer of insulation supporting said lead frame is B-staged, and said tips of said supported lead frame remain exposed; and wherein said supported lead frame with said laminated layer of insulation, and said integrated circuit chip, are laminated together, wherein said lead frame tips are fixedly aligned with said exposed integrated circuit connection pads for connection thereto.

* * * * *